(12) United States Patent
Zhou

(10) Patent No.: US 10,157,771 B2
(45) Date of Patent: Dec. 18, 2018

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/665,695

(22) Filed: Aug. 1, 2017

(65) Prior Publication Data

US 2018/0047613 A1   Feb. 15, 2018

(30) Foreign Application Priority Data

Aug. 9, 2016   (CN) .......................... 2016 1 0646956

(51) Int. Cl.
*H01L 21/00*   (2006.01)
*H01L 29/00*   (2006.01)
(Continued)

(52) U.S. Cl.
CPC ........ *H01L 21/7624* (2013.01); *H01L 21/765* (2013.01); *H01L 21/823431* (2013.01);
(Continued)

(58) Field of Classification Search
CPC .............. H01L 21/7624; H01L 21/765; H01L 21/823842; H01L 21/823878;
(Continued)

(56) References Cited

U.S. PATENT DOCUMENTS 8,866,206 B2 * 10/2014 Sudo ............... H01L 21/823431
257/288
9,385,189 B1 * 7/2016 Sung ................... H01L 29/0638
(Continued)

FOREIGN PATENT DOCUMENTS

EP   3190610 A2   7/2017

OTHER PUBLICATIONS

The European Patent Office (EPO) The Extended European Search Report for 17185160.3 dated Jan. 3, 2018 9 Pages.

*Primary Examiner* — Nikolay Yushin
(74) *Attorney, Agent, or Firm* — Anova Law group, PLLC

(57) ABSTRACT

A semiconductor device and a method for fabricating the semiconductor device are provided. The method includes providing a semiconductor substrate including a first region and a second region, and forming a plurality of fins on the semiconductor substrate in the first region and the second region. The method also includes forming a first barrier layer on surfaces of the fins in the first region, and forming an isolation fluid layer on the semiconductor substrate to cover the first barrier layer in the first region and to cover the fins in the second region. Further, the method includes forming an isolation film and a by-product layer by an oxygen-containing annealing process respectively from the isolation fluid layer and sidewalls of the fins in the second region.

20 Claims, 10 Drawing Sheets

(51) Int. Cl.
*H01L 21/762* (2006.01)
*H01L 21/765* (2006.01)
*H01L 21/8238* (2006.01)
*H01L 29/51* (2006.01)
*H01L 29/66* (2006.01)
*H01L 21/8234* (2006.01)

(52) U.S. Cl.
CPC ........... *H01L 21/823842* (2013.01); *H01L 21/823878* (2013.01); *H01L 29/515* (2013.01); *H01L 29/66787* (2013.01); *H01L 29/66818* (2013.01)

(58) Field of Classification Search
CPC ............ H01L 29/515; H01L 29/66787; H01L 29/66795; H01L 29/6785; H01L 29/7851
See application file for complete search history.

(56) References Cited

U.S. PATENT DOCUMENTS

| | | |
|---|---|---|
| 2011/0151677 A1 | 6/2011 | Wang et al. |
| 2013/0037871 A1* | 2/2013 | Sudo ............... H01L 21/823431 257/295 |
| 2015/0064929 A1 | 3/2015 | Tseng et al. |
| 2015/0140787 A1 | 5/2015 | Zhang et al. |
| 2015/0171085 A1 | 6/2015 | Fumitake et al. |
| 2015/0200297 A1 | 7/2015 | Lee et al. |
| 2015/0372144 A1 | 12/2015 | Fang et al. |

* cited by examiner

SEMICONDUCTOR DEVICE AND FABRICATION METHOD THEREOF

CROSS-REFERENCES TO RELATED APPLICATIONS

This application claims the priority of Chinese patent application No. 201610646956.8, filed on Aug. 9, 2016, the entirety of which is incorporated herein by reference.

FIELD OF THE DISCLOSURE

The present disclosure generally relates to the field of semiconductor manufacturing technology and, more particularly, relates to a semiconductor device and fabrication method thereof.

BACKGROUND

Metal-oxide-semiconductor (MOS) transistor is one of the most important components in modern integrated circuits. The basic structure of the MOS transistor includes a semiconductor substrate, a gate structure formed on the semiconductor substrate, and source and drain doped regions formed in the semiconductor substrate on both sides of the gate structure. The gate structure includes a gate dielectric layer formed on the semiconductor substrate, and a gate electrode layer formed on the gate dielectric layer.

With the development of semiconductor technology, the control capability of the conventional planar MOS transistor on the channel current is reduced, causing a serious leakage current. A fin field effect transistor (FinFET) is one of emerging multifaceted-gate devices. The FinFET generally includes one or more protruding fins formed on a substrate, a gate structure across a length portion of the fins and covering a portion of a top surface and sidewalls of each fin, and source and drain doped regions formed in the fin on both sides of the gate structure.

Fins having different widths need to be formed to meet the requirements of different functional devices. For example, width of the fin of the FinFET needs to decrease to reduce a short-channel effect. In a varactor diode, to improve the quality factor, width of the fin of the varactor diode needs to increase to reduce the resistance of the fin in the varactor diode.

However, conventional methods for forming the fins having different widths are complicated. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a semiconductor substrate including a first region and a second region, and forming a plurality of fins on the semiconductor substrate in the first region and the second region. The method also includes forming a first barrier layer on surfaces of the fins in the first region, and forming an isolation fluid layer on the semiconductor substrate to cover the first barrier layer in the first region and to cover the fins in the second region. Further, the method includes forming an isolation film and a by-product layer by an oxygen-containing annealing process respectively from the isolation fluid layer and sidewalls of the fins in the second region.

Another aspect of the present disclosure includes a semiconductor device. The semiconductor device includes a semiconductor substrate including a first region and a second region, and a plurality of fins on the semiconductor substrate in the first region and the second region. Widths of the fins in the first region are larger than widths of the fins in the second region. The semiconductor device also includes a first barrier layer on the semiconductor substrate and covering portions of sidewalls of the fins in the first region, and a by-product layer on the semiconductor substrate and covering portions of sidewalls of the fins in the second region. Further, the semiconductor device includes an isolation film on the semiconductor substrate and covering the first barrier layer and the by-product layer. Surfaces of the isolation film, the first barrier layer and the by-product layer are coplanar and are lower than top surfaces of the fins.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

A method for forming a semiconductor device may include providing a semiconductor substrate including a first region and a second region. A plurality of fins may be formed on the semiconductor substrate in the first region and the second region. The method may also include forming a first mask layer on the fins in the first region. The first mask layer may expose surfaces of the fins in the second region. In addition, the method may include oxidizing the surfaces of the fins in the second region by using the first mask layer as a mask to form an oxide layer on the surfaces of the fins in the second region. Moreover, the method may include etching and removing the oxide layer by using the first mask layer as a mask to reduce widths of the fins in the second region. Further, the method may include removing the first mask layer. Therefore, widths of the fins in the first region may be larger than the widths of the fins in the second region.

Such fabrication method is complicated. To reduce the widths of the fins in the second region, the following steps may need to be performed. The first mask layer may be formed; an oxidation process may be performed to oxide the surfaces of the fins in the second region; an etching process may be performed to remove the oxide layer; and the first mask layer may be removed after removing the oxide layer. Therefore, by using such a complicated method for forming the semiconductor device, the widths of the fins in the second region may be reduced.

Figure 18:
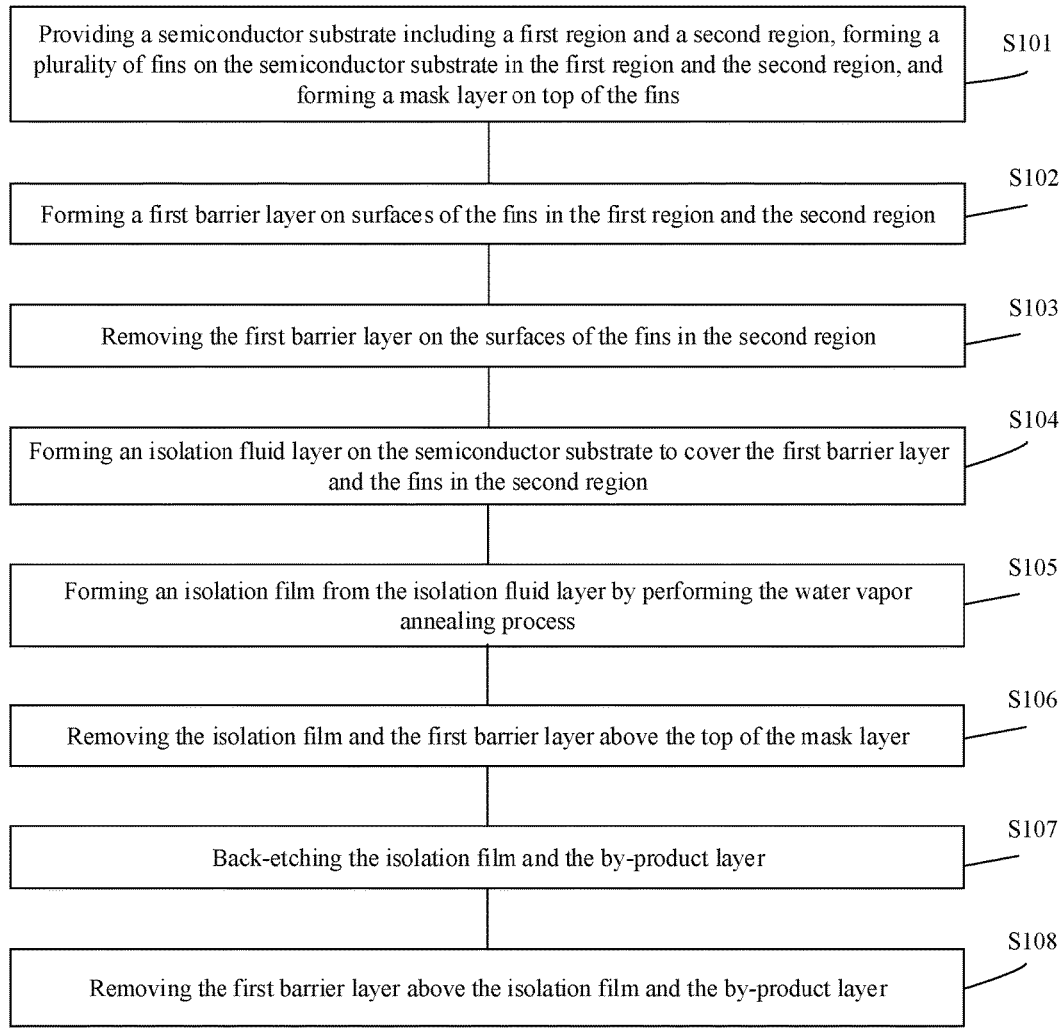
FIG. 18 illustrates an exemplary fabrication method for forming a semiconductor device consistent with various disclosed embodiments of the present disclosure.

The present disclosure provides a semiconductor device and fabrication method thereof. FIG. 18 illustrates an exemplary fabrication method for forming a semiconductor device consistent with the disclosed embodiments; and FIGS. 1-8 illustrate semiconductor structures corresponding to certain stages of the exemplary fabrication method.

Figure 1:
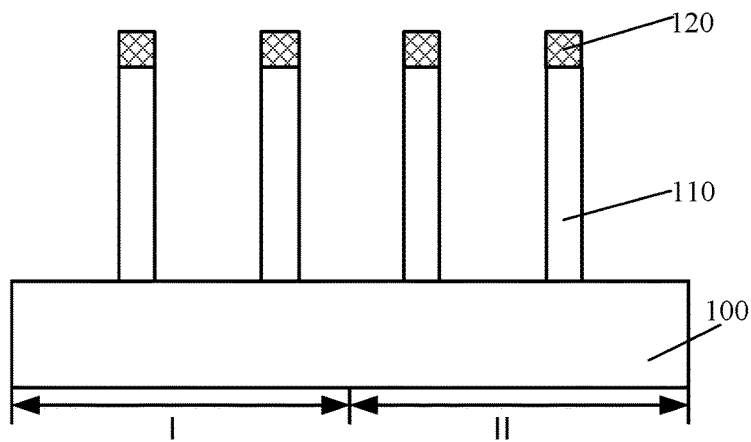
FIGS. 1-8 illustrate semiconductor structures corresponding to certain stages of an exemplary fabrication method for forming a semiconductor device consistent with various disclosed embodiments of the present disclosure.

As shown in FIG. 18, at the beginning of the fabrication method, a semiconductor substrate with certain structures may be provided (S101). FIG. 1 illustrates a corresponding semiconductor structure.

Referring to FIG. 1, a semiconductor substrate 100 may be provided. The semiconductor substrate 100 may include a first region I and a second region II. A plurality of fins 110 may be formed on the semiconductor substrate 100 in the first region I and the second region II.

The semiconductor substrate 100 may provide a platform for subsequent fabrication processes for forming the semiconductor device. The semiconductor substrate 100 may include monocrystalline silicon, polysilicon, or amorphous silicon. The semiconductor substrate 100 may also include silicon (Si), germanium (Ge), germanium-silicon alloy (GeSi), or gallium arsenide (GaAs) and other Group III-V compounds. In addition, the semiconductor substrate 100 may include any other appropriate semiconductor material(s). In one embodiment, the semiconductor substrate 100 may be a monocrystalline silicon substrate.

In one embodiment, the plurality of fins 110 may be formed by etching the semiconductor substrate 100. For example, a mask layer 120 may be formed on the semiconductor substrate 100 to define the positions of the fins 110. Portions of the semiconductor substrate 100 may be etched by using the mask layer 120 as a mask to form the fins 110.

In one embodiment, the mask layer 120 may be made of silicon nitride, or silicon oxynitride, etc. In certain embodiments, the mask layer may be made of photoresist. In one embodiment, the mask layer 120 may be retained after forming the fins 110. In certain embodiments, the mask layer 120 may be removed after forming the fins 110. In one embodiment, the mask layer 120 may protect top surfaces of the fins 110 from being affected by a subsequent oxygen-containing annealing process.

In certain embodiments, a fin material layer (not illustrated) may be formed on the semiconductor substrate; and then the fin material layer may be patterned to form the fins. The fins 110 may be made of silicon, germanium, or germanium silicon. In one embodiment, the fins 110 may be made of monocrystalline silicon, monocrystalline germanium, or single crystal silicon germanium.

The number of the fins 110 in the first region I may be more than one, and the number of the fins 110 in the second region II may be more than one. In one embodiment, the number of the fins 110 in the first region I is two and the number of the fins 110 in the second region II is two as an example.

In some embodiments when the mask layer 120 is retained after forming the fins 110, before subsequently forming a first barrier layer, an interface layer (not illustrated) may be formed to cover sidewalls of the fins 110. In other embodiments when the mask layer 120 is not retained after forming the fins 110, before subsequently forming the first barrier layer, an interface layer may be formed to cover top surfaces and sidewalls of the fins 110.

The interface layer may be used to repair etching damages caused when forming the fins 110. In one embodiment, the interface layer may be made of silicon oxide. The process for forming the interface layer may include a linear oxidation process. The interface layer may be capable of slowing the oxidation rate of the subsequent oxygen-containing annealing process on the fins 110 in the second region II to a certain extent, thus the widths of the fins 110 in the second region II after a water vapor annealing process may be better controlled.

Figure 2:
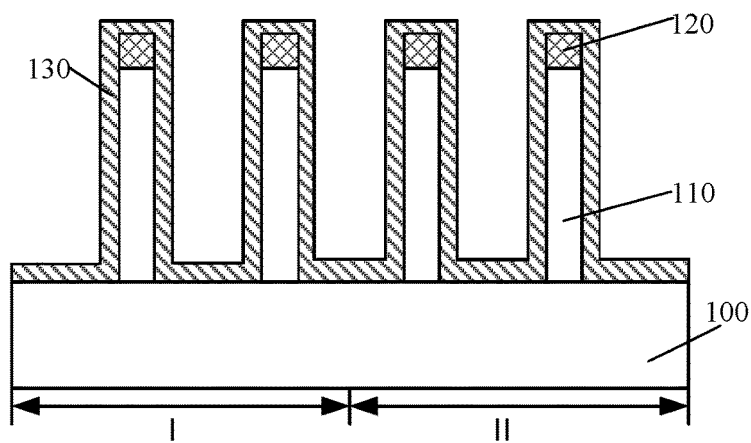

Returning to FIG. 18, after providing the semiconductor substrate, a first barrier layer may be formed (S102). FIG. 2 illustrates a corresponding semiconductor structure.

Referring to FIG. 2, a first barrier layer 130 may be formed on the surfaces of the fins 110 in the first region I and the second region II. The first barrier layer 130 may be formed by a deposition process, such as a plasma chemical vapor deposition process, a sub-atmospheric chemical vapor deposition process, a low-pressure chemical vapor deposition process, or an atomic layer deposition process, etc.

In one embodiment, the first barrier layer 130 may be made of silicon nitride. In certain embodiments, the first barrier layer may be made of silicon oxynitride, or silicon oxycarbide, etc.

Figure 3:
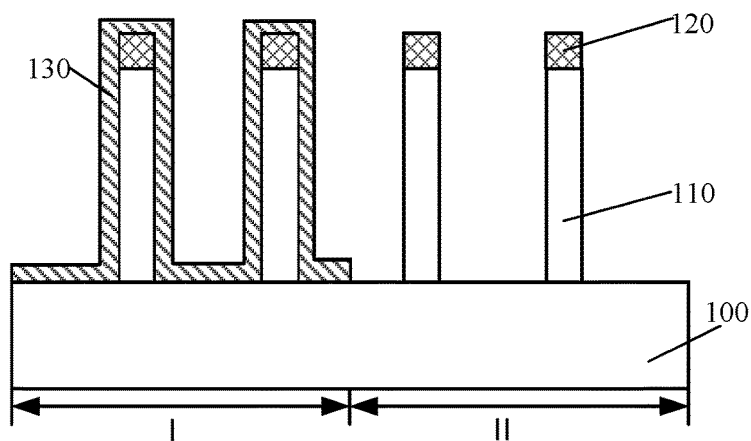

Returning to FIG. 18, after forming the first barrier layer, the first barrier layer on the surfaces of the fins in the second region II may be removed (S103). FIG. 3 illustrates a corresponding semiconductor structure.

Referring to FIG. 3, the method for removing the first barrier layer 130 on the surfaces of the fins 110 in the second region II may include: forming a photoresist layer (not illustrated) to cover the first barrier layer 130 in the first region I, where the photoresist layer may expose the first barrier layer 130 in the second region II; performing a dry etching process and/or a wet etching process by using the photoresist layer as a mask to etch and remove the first barrier layer 130 in the second region II; and removing the photoresist layer.

In one embodiment, because the mask layer 120 is retained, the first barrier layer 130 may also cover the mask layer 120 in the first region I. Because the first barrier layer 130 covers the sidewalls of the fins 110 in the first region I and exposes the sidewalls of the fins 110 in the second region II, during the subsequent oxygen-containing annealing process, the first barrier layer 130 may block oxidation of the fins 110 in the first region I by the oxygen-containing annealing process, and the fins 110 in the second region II may be exclusively oxidized. Correspondingly, a thickness of the first barrier layer 130 may be larger than or equal to a first threshold value. In another embodiment, an oxidation rate of the oxygen-containing annealing process on the fins 110 in the first region I may be less than an oxidation rate of the oxygen-containing annealing process on the fins 110 in the second region II. Correspondingly, the thickness of the first barrier layer 130 may be larger than zero and smaller than the first threshold value. In one embodiment, the first threshold value may be in a range of approximately 10 Å-40 Å, including 10 Å, 20 Å, 35 Å, or 40 Å, etc.

When the first barrier layer 130 is made of silicon nitride, the first barrier layer 130 may be capable of buffering the stress of a subsequently formed isolation structure on the fins 110 in the first region I.

Figure 4:
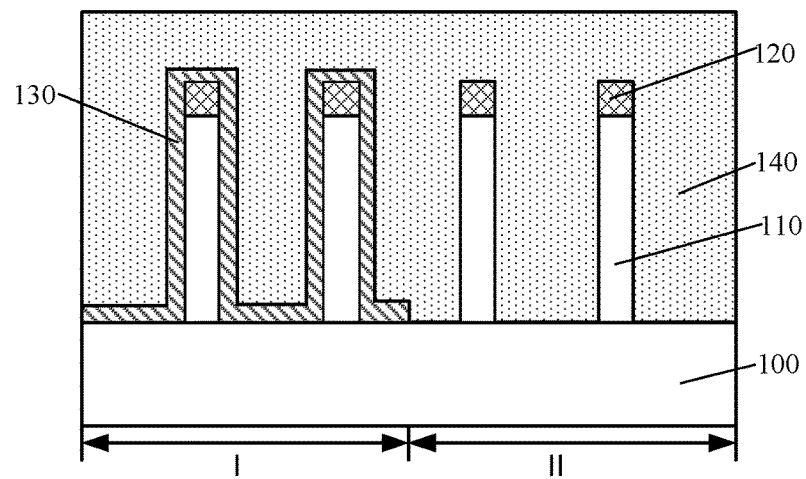

Returning to FIG. 1, after removing the first barrier layer on the surfaces of the fins in the second region II, an isolation fluid layer may be formed (S104). FIG. 4 illustrates a corresponding semiconductor structure.

Referring to FIG. 4, an isolation fluid layer 140 may be formed on the semiconductor substrate 100 to cover the first barrier layer 130 in the first region I and to cover the fins 110 in the second region II. Because the mask layer 120 is retained on the top of the fins 110, the isolation fluid layer 140 may also cover the mask layer 120. The isolation fluid layer 140 may contain a large amount of hydrogen, and the isolation fluid layer 140 may be in a form of fluid.

The parameters of the fluid chemical vapor deposition process for forming the isolation fluid layer 140 may include the following. The gases may include $NH_3$ and $(SiH_3)_3N$, the flow rate of $NH_3$ may be in a range of approximately 1 sccm—1000 sccm, the flow rate of $(SiH_3)_3N$ may be in a range of approximately 3 sccm—800 sccm, and the temperature may be in a range of approximately 50° C.-100° C.

After forming the isolation fluid layer 140, an oxygen-containing annealing process may be performed. On the one hand, the oxygen-containing annealing process may reduce the hydrogen content in the isolation fluid layer 140; on the other hand, the oxygen-containing annealing process may be capable of oxidizing the sidewalls of the fins 110 in the second region II. In one embodiment, the oxygen-containing annealing process may include a water vapor annealing process.

Figure 5:
Figure 5:
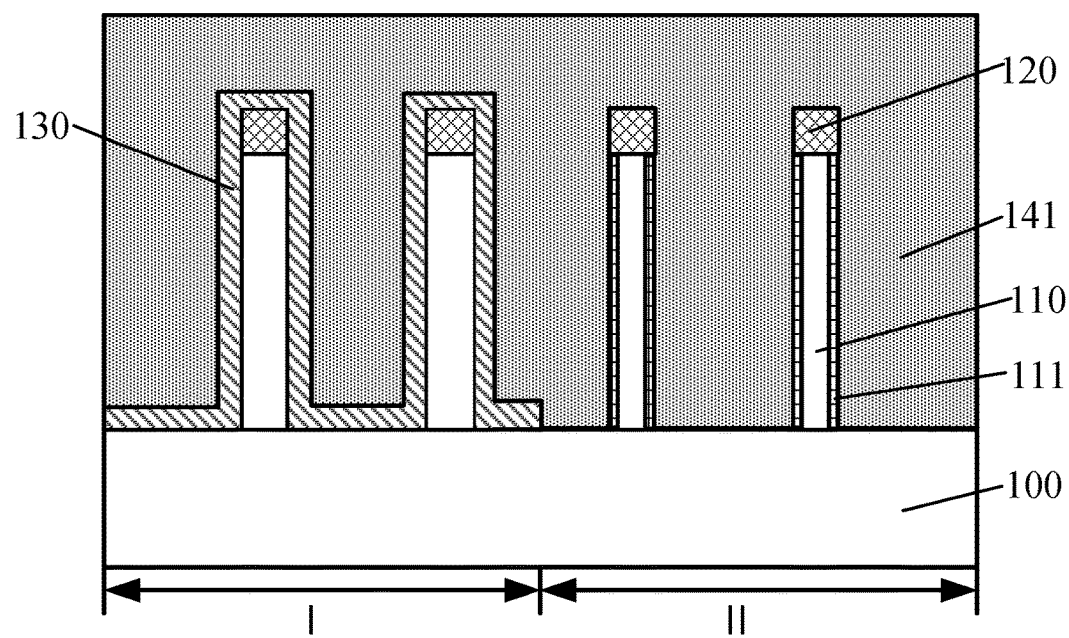

Returning to FIG. 18, after forming the isolation fluid layer, an isolation film may be formed (S105). FIG. 5 illustrates a corresponding semiconductor structure.

Referring to FIG. 5, the water vapor annealing process may be performed to form an isolation film 141 from the isolation fluid layer 140 (shown in FIG. 4). In one embodiment, the isolation film 141 may be made of silicon oxide. The parameters of the water vapor annealing process may include the following. The gases may include oxygen gas, ozone, and gaseous water, and the annealing temperature may be in a range of approximately 350° C.-750° C.

When performing the water vapor annealing process, the oxygen gas, ozone and gaseous water may be respectively used to treat the isolation fluid layer 140 at a temperature in a range of approximately 350° C.-750° C. On the one hand, the oxygen gas, ozone and oxygen in the gaseous water may replace portions or all of the hydrogen in the isolation fluid layer 140 to reduce the hydrogen content in the isolation fluid layer 140. On the other hand, at the temperature in a range of approximately 350° C.-750° C., the isolation fluid layer 140 may be changed from a fluid form to a solid form, such that the isolation film 141 may be formed.

In addition, the water vapor annealing process may be capable of oxidizing the sidewalls of the fins 110 in the second region II, and the corresponding regions of the oxidized fins 110 in the second region II may form a by-product layer 111.

When performing the water vapor annealing process, oxygen gas, ozone and oxygen in the gaseous water may be diffused to the surfaces of the fins 110 in the second region II. The oxygen diffused to the surfaces of the fins 110 in the second region II may oxidize the sidewalls of the fins 110 in the second region II, and may be capable of reducing the widths of the fins 110 in the second region II.

If the thickness of the first barrier layer 130 is small than the first threshold value, oxygen gas, ozone and oxygen in the gaseous water may also be diffused to the surfaces of the fins 110 in the first region I. The oxygen diffused to the surfaces of the fins 110 in the first region I may oxidize the sidewalls of the fins 110 in the first region I, as a result, the widths of the fins 110 in the first region I may also be reduced. In this case, the oxidation rate of the water vapor annealing process on the fins 110 in the first region I may be smaller than the oxidation rate of the water vapor annealing process on the fins 110 in the second region II, thus, the widths of the fins 110 in the first region I may be larger than the widths of the fins 110 in the second region II after performing the water vapor annealing process.

The fluid chemical vapor deposition process may also include performing a densification annealing treatment on the isolation film 141 after performing the water vapor annealing process. The parameters of the densification annealing treatment may include the following. The gas may include nitrogen gas, and the annealing temperature may be in a range of approximately 800° C.-1050° C.

The densification annealing treatment may densify the internal structure of the isolation film 141. In addition, if the hydrogen remains in the isolation film 141, the densification annealing treatment may be capable of further removing the hydrogen in the isolation film 141.

Figure 6:
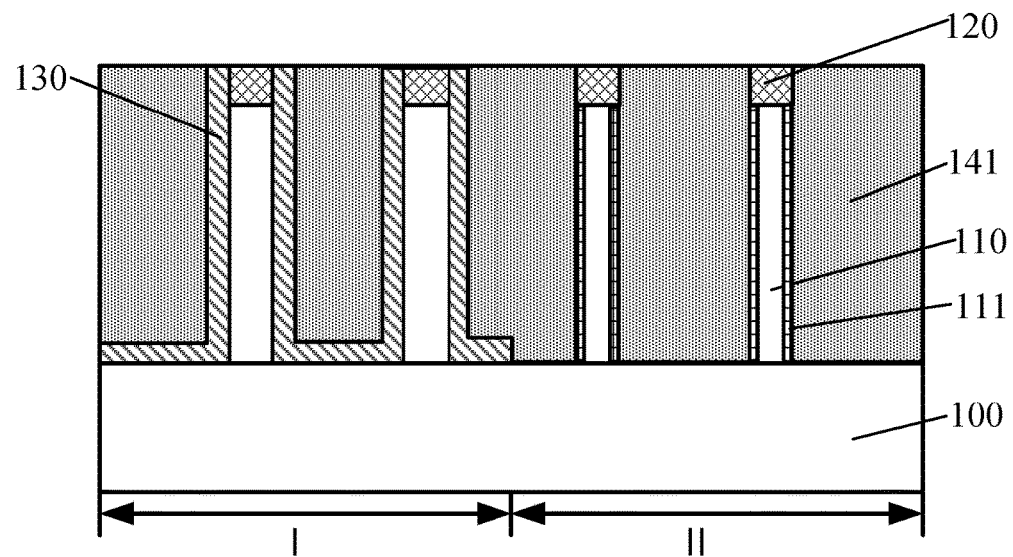

Returning to FIG. 18, after forming the isolation film, the isolation film and the first barrier layer above the top of the mask layer may be removed (S106). FIG. 6 illustrates a corresponding semiconductor structure.

Referring to FIG. 6, the isolation film 141 and the first barrier layer 130 above the top of the mask layer 120 may be removed. The process for removing the isolation film 141 and the first barrier layer 130 above the top of the mask layer 120 may include a planarization process, such as a chemical mechanical polishing process.

In certain embodiments, when the mask layer is not retained on the top surfaces of the fins, the planarization process may be used to remove the isolation film and the first barrier layer above the top of the fins.

Figure 7:
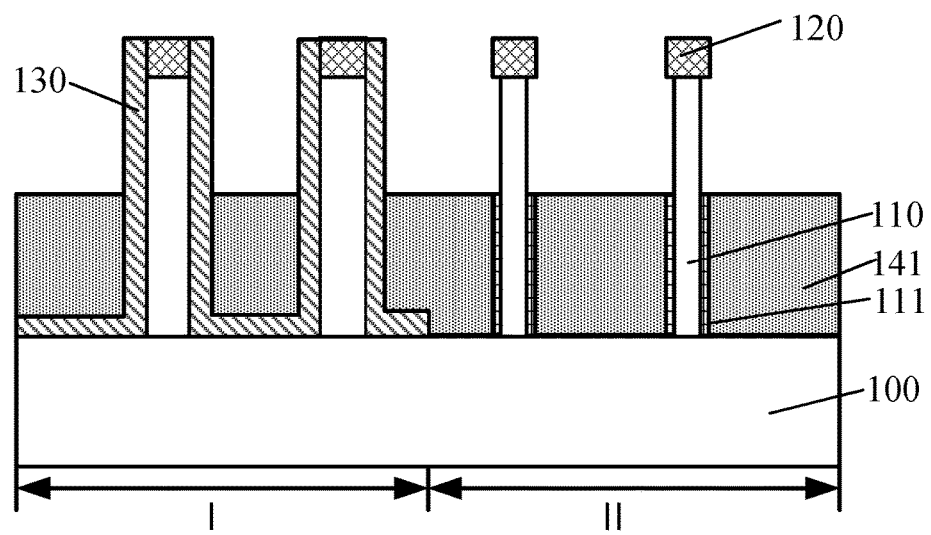

Returning to FIG. 18, after removing the isolation film and the first barrier layer above the top of the mask layer, the isolation film and the by-product layer may be back-etched (S107). FIG. 7 illustrates a corresponding semiconductor structure.

Referring to FIG. 7, the isolation film 141 and the by-product layer 111 may be back-etched, such that the surfaces of the isolation film 141 and the by-product layer 111 may be lower than the top surfaces of the fins 110.

Figure 8:
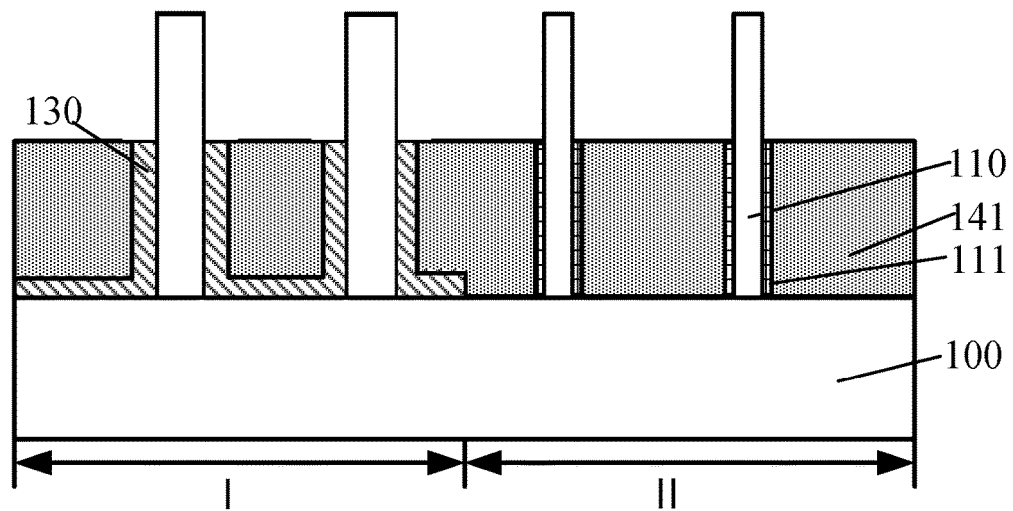

Returning to FIG. 18, after back-etching the isolation film and the by-product layer, the first barrier layer above the isolation film and the by-product layer may be etched (S108). FIG. 8 illustrates a corresponding semiconductor structure.

Referring to FIG. 8, the first barrier layer 130 above the isolation film 141 and the by-product layer 111 may be etched. In one embodiment, because the mask layer 120 may be made of the same material as the first barrier layer, the mask layer 120 may also be removed while removing the first barrier layer 130 above the isolation film 141 and the by-product layer 111.

In certain embodiments, the mask layer may be removed after back-etching the isolation film, the first barrier layer and the by-product layer. In certain other embodiments, when the isolation film, the first barrier layer and the by-product layer are made of the same material, the isolation film, the first barrier layer and the by-product layer may be etched in the same, single etching process, such that the surfaces of the isolation film, the first barrier layer and the by-product layer may be lower than the top surfaces of the fins.

Figure 19:
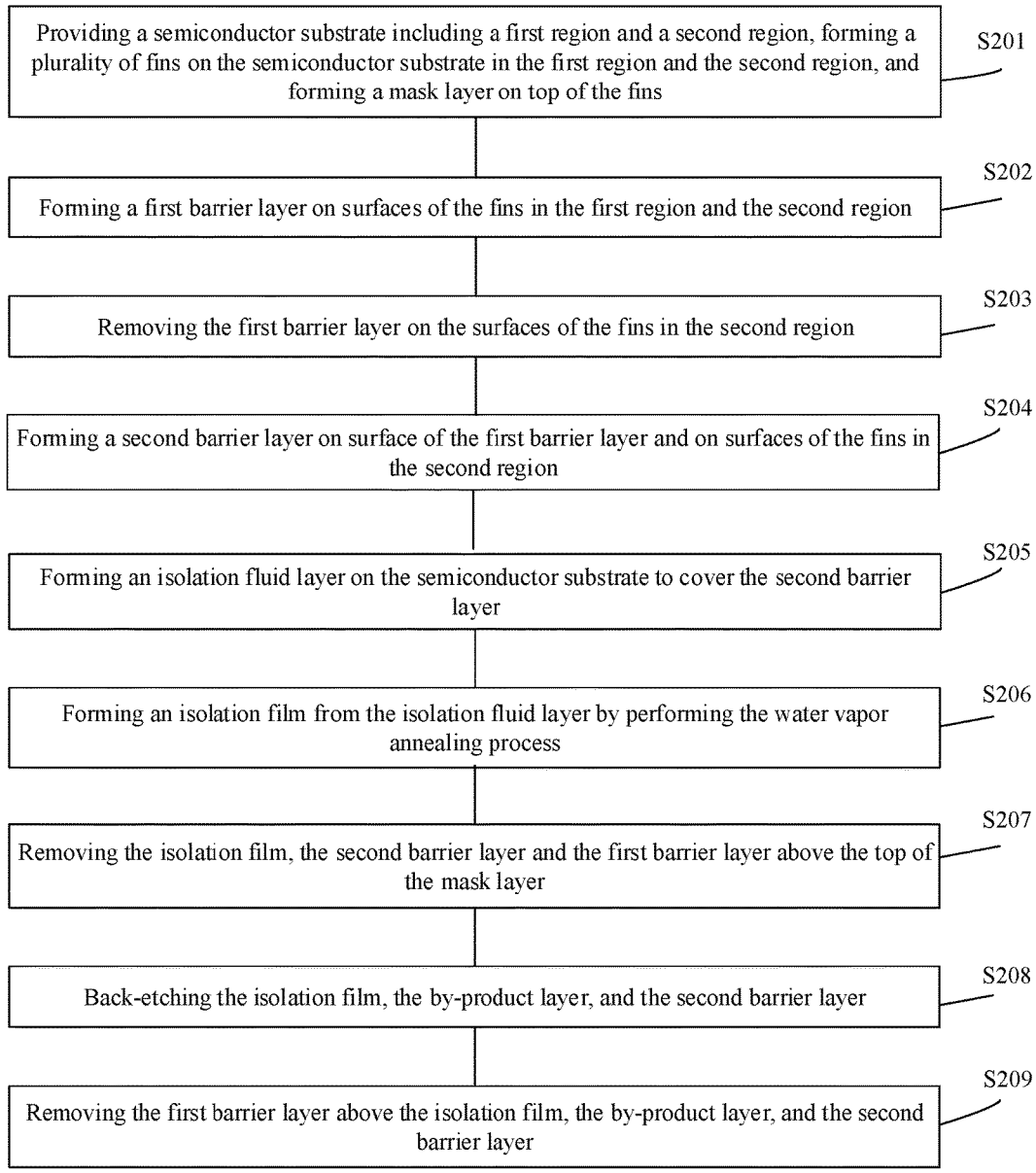
FIG. 19 illustrates another exemplary fabrication method for forming a semiconductor device consistent with various disclosed embodiments of the present disclosure.

FIG. 19 illustrates another exemplary fabrication method for forming a semiconductor device consistent with the disclosed embodiments; and FIGS. 9-17 illustrate semiconductor structures corresponding to certain stages of the exemplary fabrication method.

Figure 9:
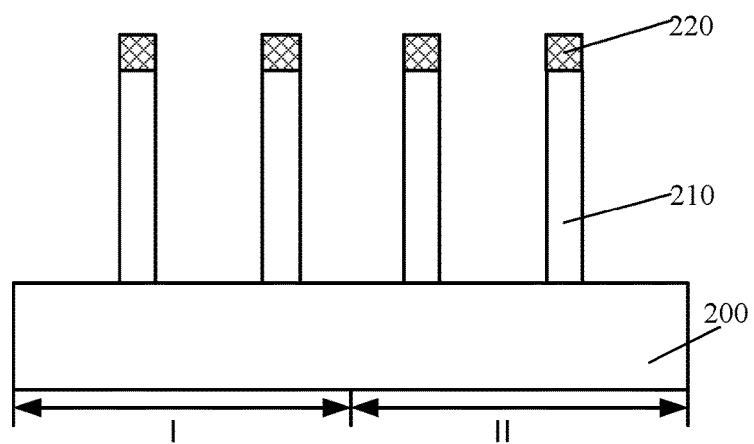
FIGS. 9-17 illustrate semiconductor structures corresponding to certain stages of another exemplary fabrication method for forming a semiconductor device consistent with various disclosed embodiments of the present disclosure.

As shown in FIG. 19, at the beginning of the fabrication method, a semiconductor substrate with certain structures may be provided (S201). FIG. 9 illustrates a corresponding semiconductor structure.

Referring to FIG. 9, a semiconductor substrate 200 may be provided. The semiconductor substrate 200 may include a first region I and a second region II. A plurality of fins 210 may be formed on the semiconductor substrate 200 in the first region I and the second region II.

In one embodiment, the plurality of fins 210 may be formed by etching the semiconductor substrate 200. For example, a mask layer 220 may be formed on the semiconductor substrate 200 to define the positions of the fins 210. Portions of the semiconductor substrate 200 may be etched by using the mask layer 220 as a mask to form the fins 210. The mask layer 220 may be retained after forming the fins 210. The methods for forming the substrate 200, the fins 210, and the mask layer 220 can be referred to the above-described embodiment, and are omitted herein.

Figure 10:
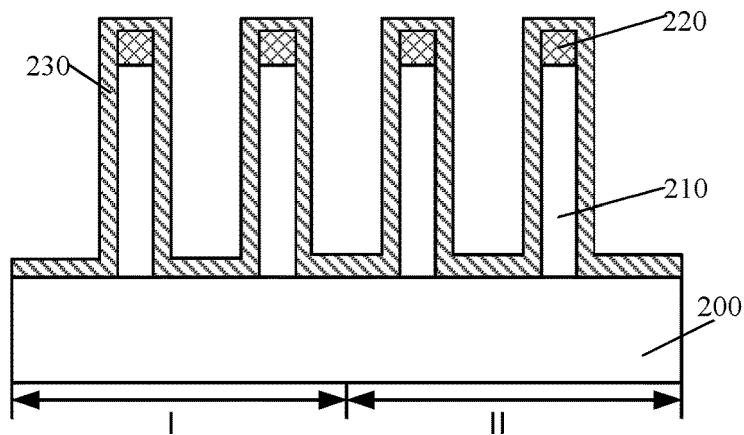

Returning to FIG. 19, after providing the semiconductor substrate, a first barrier layer may be formed (S202). FIG. 10 illustrates a corresponding semiconductor structure.

Referring to FIG. 10, a first barrier layer 230 may be formed on the surfaces of the fins 210 in the first region I and the second region II. In one embodiment, because the mask layer 220 is retained, the first barrier layer 230 may also cover the mask layer 220 in the first region I and the second region II. The methods for forming the first barrier layer 230 can be referred to the above-described embodiment, and are omitted herein.

Figure 11:
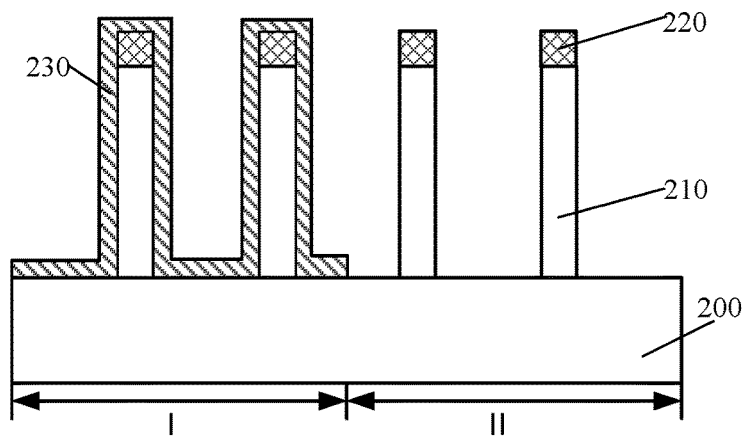

Returning to FIG. 19, after forming the first barrier layer, the first barrier layer on the surfaces of the fins in the second region may be removed (S203). FIG. 11 illustrates a corresponding semiconductor structure.

Referring to FIG. 11, the first barrier layer 230 on the surfaces of the fins 210 in the second region II may be removed. In one embodiment, the first barrier layer 230 may cover the sidewalls of the fins 210 in the first region I and may expose the sidewalls of the fins 210 in the second region II. The methods for removing the first barrier layer 230 in the second region II can be referred to the above-described embodiment, and are omitted herein.

Figure 12:
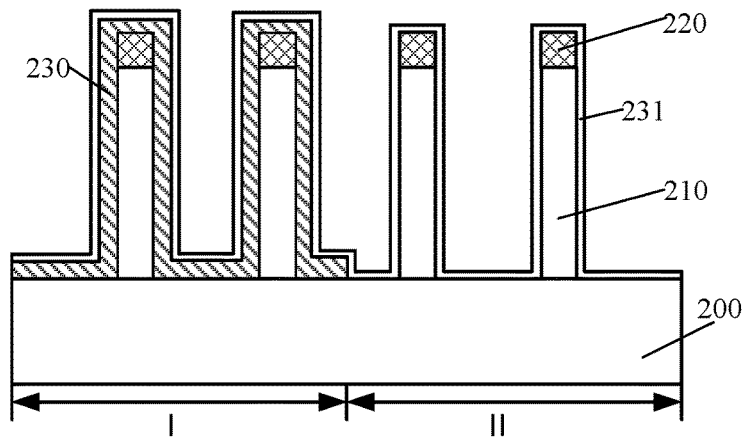

Returning to FIG. 19, after removing the first barrier layer on the surfaces of the fins in the second region, a second barrier layer on surface of the first barrier layer and on surfaces of the fins in the second region may be formed (S204). FIG. 12 illustrates a corresponding semiconductor structure.

Referring to FIG. 12, a second barrier layer 231 may be formed on surface of the first barrier layer 230 and on surfaces of the fins 210 in the second region II. In one embodiment, the second barrier layer 231 may be made of silicon oxide. In certain embodiments, the second barrier layer 231 may be made of silicon nitride, or amorphous silicon, etc.

An isolation fluid layer may be subsequently formed to cover the second barrier layer 231. When subsequently performing an oxygen-containing annealing process on the isolation fluid layer, because the second barrier layer 231 is formed between the isolation fluid layer and the fins 210 in the second region II, the isolation fluid layer may be prevented from being directly contacted with the fins 210 in the second region II. Thus, the second barrier layer 231 in the second region II may reduce the oxidation rate of the oxygen-containing annealing process on the fins 210 in the second region II, and the widths of the fins 210 in the second region II after performing the oxygen-containing annealing process may be better controlled.

A thickness of the second barrier layer 231 may be selected in an appropriate range. If the thickness of the second barrier layer 231 is too small, the control capability of the second barrier layer 231 on the oxidation rate of the fins 210 in the second region II may be reduced. If the thickness of the second barrier layer 231 is too large, the subsequent oxidation of the oxygen-containing annealing process on the fins 210 in the second region II may be seriously hindered, therefore it may take long time for the fins 210 in the second region II to reach the desired width, and the efficiency of the oxygen-containing annealing process may be reduced. In one embodiment, the thickness of the second barrier layer 231 may be in a range of approximately 8 Å-30 Å.

When the second barrier layer 231 is made of silicon nitride, the second barrier layer 231 may be capable of buffering the stress of a subsequently formed isolation structure on the fins 210 in the second region II.

Figure 13:
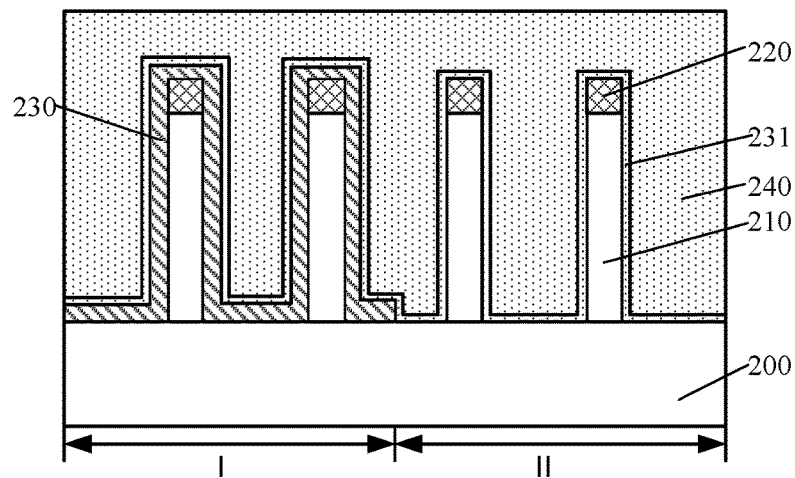

Returning to FIG. 19, after forming the second barrier layer, an isolation fluid layer may be formed (S205). FIG. 13 illustrates a corresponding semiconductor structure.

Referring to FIG. 13, an isolation fluid layer 240 may be formed on the semiconductor substrate 200 to cover the second barrier layer 231. The process parameters to form the isolation fluid layer 240 may be referred to the process parameters to form the isolation fluid layer 140 in the above-described embodiment, and are omitted herein.

After forming the isolation fluid layer 240, an oxygen-containing annealing process may be performed. On the one hand, the oxygen-containing annealing process may reduce the hydrogen content in the isolation fluid layer 240; on the other hand, the oxygen-containing annealing process may be capable of oxidizing the sidewalls of the fins 210 in the second region II. In one embodiment, the oxygen-containing annealing process may include a water vapor annealing process.

Figure 14:
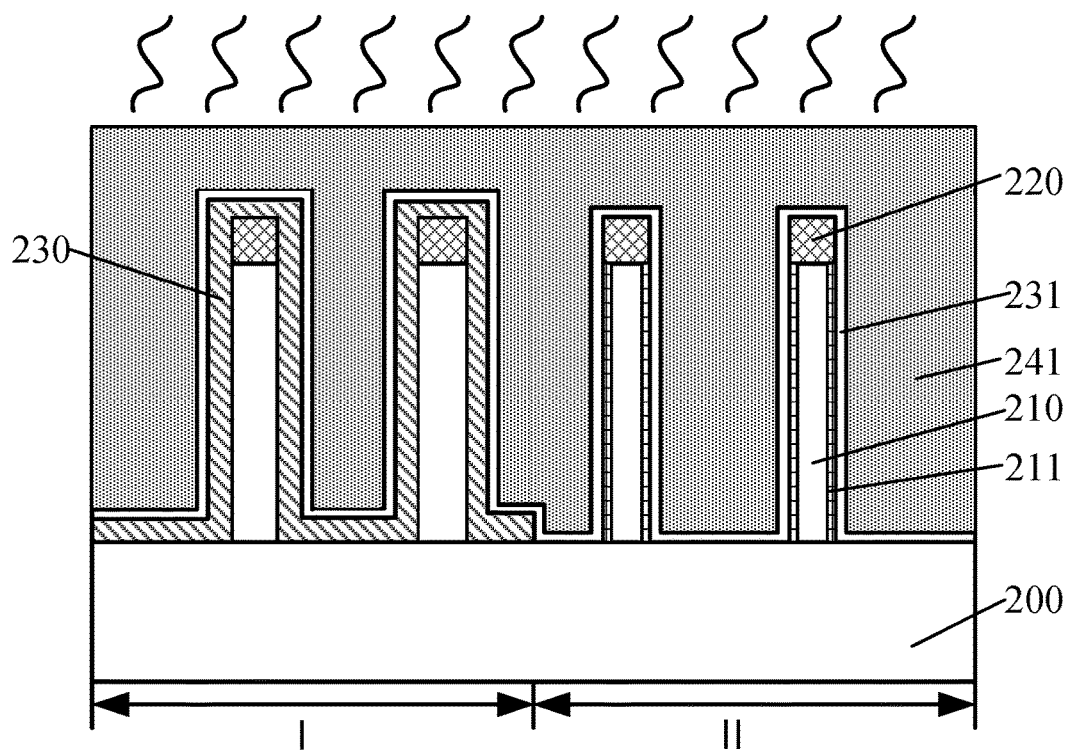

Returning to FIG. 19, after forming the isolation fluid layer, an isolation film may be formed (S206). FIG. 14 illustrates a corresponding semiconductor structure.

Referring to FIG. 14, a water vapor annealing process may be performed to form an isolation film 241 from the isolation fluid layer 240 (shown in FIG. 13). In one embodiment, the isolation film 241 may be made of silicon oxide. The parameters and functions of the water vapor annealing process may be referred to the above-described embodiment, and are omitted herein.

In addition, the water vapor annealing process may be capable of oxidizing the sidewalls of the fins 210 in the second region II. The corresponding regions of the oxidized fins 210 in the second region II may form a by-product layer 211.

The fluid chemical vapor deposition process may also include performing a densification annealing treatment on the isolation film 241 after performing the water vapor annealing process. The parameters of the densification annealing treatment may be referred to the above-described embodiment, and are omitted herein.

The first barrier layer 230 may be formed between the second barrier layer 231 in the first region I and the fins 210 in the first region I, while the first barrier layer 230 may not be formed between the second barrier layer 231 in the second region II and the fins 210 in the second region II. During the water vapor annealing process, the hindering effect of the second barrier layer 231 and the first barrier layer 230 in the first region I to oxygen may be stronger than the hindering effect of the second barrier layer 231 in the second region II to oxygen. In one embodiment, the water vapor annealing process may oxide the fins 210 in both the first region I and the second region II, while the oxidation rate of the water vapor annealing process on the fins 210 in the first region I may be smaller than the oxidation rate of the water vapor annealing process on the fins 210 in the second region II. In another embodiment, the water vapor annealing process may exclusively oxidize the fins 210 in the second region II. Therefore, after performing the water vapor annealing process, the widths of the fins 210 in the second region II may be smaller than the widths of the fins 210 in the first region I.

Figure 15:
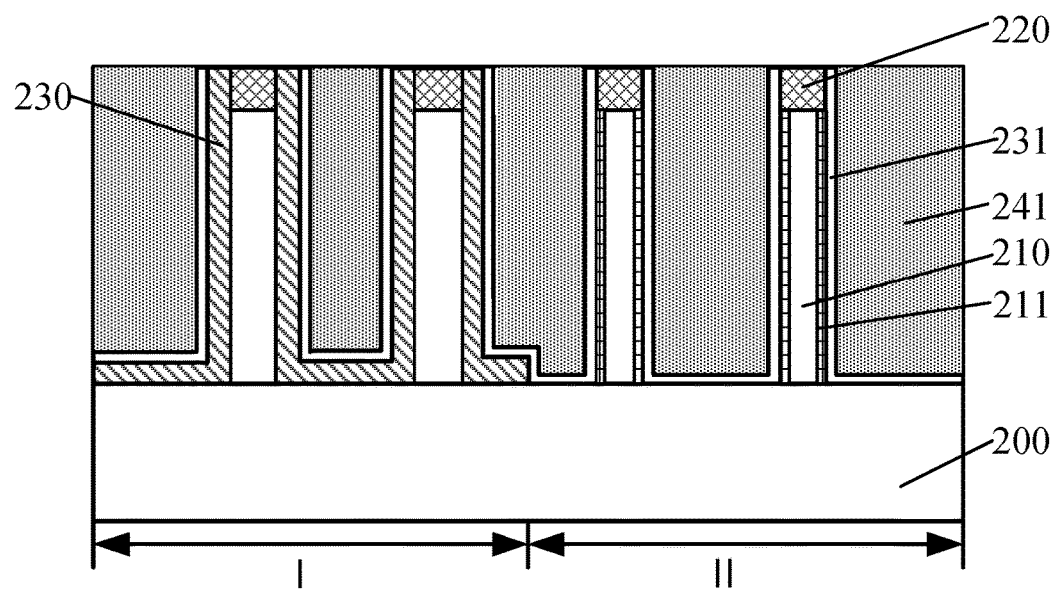

Returning to FIG. 19, after forming the isolation film, the isolation film, the first barrier layer and the second barrier layer above the top of the mask layer may be removed (S207). FIG. 15 illustrates a corresponding semiconductor structure.

Referring to FIG. 15, the isolation film 241, the first barrier layer 230 and the second barrier layer 231 above the top of the mask layer 220 may be removed. In certain embodiments, when the mask layer is not retained on the top surfaces of the fins, the isolation film, the first barrier layer and the second barrier layer above the top surfaces of the fins may be removed.

Figure 16:
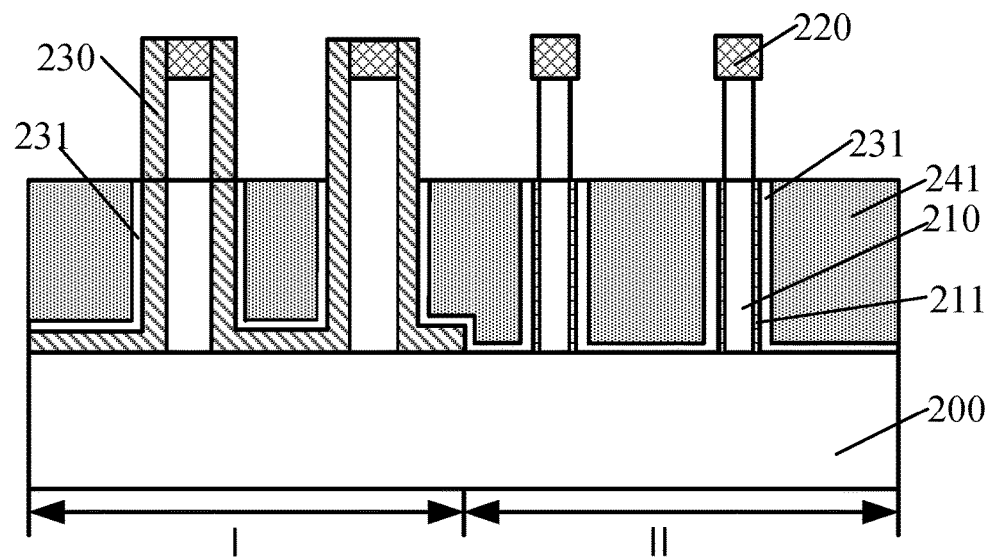

Returning to FIG. 19, after removing the isolation film, the first barrier layer, and the second barrier layer above the top of the mask layer, the isolation film, the by-product layer and the second barrier layer may be back-etched (S208). FIG. 16 illustrates a corresponding semiconductor structure.

Referring to FIG. 16, the isolation film 241, the by-product layer 211 and the second barrier layer 231 may be back-etched, such that the surfaces of the isolation film 241, the by-product layer 211 and the second barrier layer 231 may be lower than the top surfaces of the fins 210.

Figure 17:
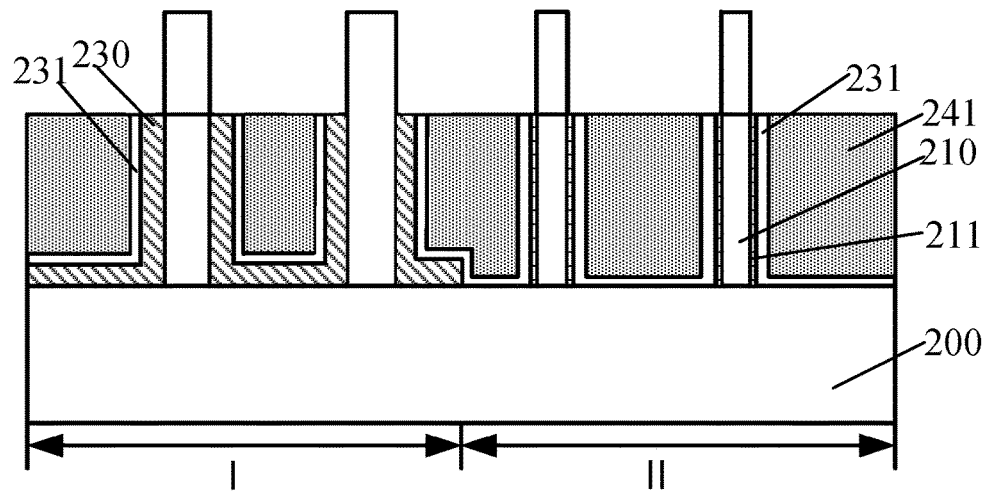

Returning to FIG. 19, after back-etching the isolation film, the by-product layer and the second barrier layer, the first barrier layer above the isolation film, the by-product layer and the second barrier layer may be etched (S209). FIG. 17 illustrates a corresponding semiconductor structure.

Referring to FIG. 17, the first barrier layer 230 above the isolation film 241, the by-product layer 211 and the second barrier layer 231 may be etched. In one embodiment, because the mask layer 220 may be made of the same material as the first barrier layer 230, the mask layer 220 may also be removed while removing the first barrier layer 230 above the isolation film 241, the by-product layer 211 and the second barrier layer 231.

In certain embodiments, when the isolation film, the first barrier layer, the second barrier layer and the by-product layer are made of the same material, the isolation layer, the first barrier layer, the second barrier layer and the by-product layer may be etched in the same, single etching process, such that the surfaces of the isolation film, the first barrier layer, the second barrier layer and the by-product layer may be lower than the top surfaces of the fins.

Accordingly, in the present disclosure, the oxygen-containing annealing process in the fluid chemical vapor deposition process to form the isolation film may act on the sidewalls of the fins in the second region. During the oxygen-containing annealing process, the oxygen-containing annealing process may oxidize the sidewalls of the fins in the second region, such that the widths of the fins in the second region may decrease. Therefore, the widths of the fins in the second region may be smaller than the widths of the fins in the first region. Because the reduction of the widths of the fins in the second region may not need additional processes, the fabrication method to form the semiconductor structure may be simplified.

A semiconductor structure is also provided in the present disclosure. The semiconductor structure may include a semiconductor substrate including a first region and a second region. The semiconductor structure may also include a plurality of fins on the semiconductor substrate in the first region and the second region. Widths of the fins in the first region may be larger than widths of the fins in the second region. In addition, the semiconductor structure may include a first barrier layer on the semiconductor substrate and covering portions of sidewalls of the fins in the first region. Moreover, the semiconductor structure may include a by-product layer on the semiconductor substrate and covering portions of sidewalls of the fins in the second region. Further, the semiconductor structure may include an isolation film on the semiconductor substrate and covering the first barrier layer in the first region and the by-product layer in the second region. The surfaces of the isolation film, the first barrier layer and the by-product layer may be coplanar and may be lower than top surfaces of the fins.

In one embodiment, the fins may be made of silicon, germanium, or silicon germanium, etc. The isolation film may be made of silicon oxide. In one embodiment, the first barrier layer may be made of silicon nitride. In certain embodiments, the first barrier layer may be made of silicon oxynitride, or silicon oxycarbide, etc. A thickness of the first barrier layer may be in a range of approximately 10 Å-40 Å.

In one embodiment, the semiconductor structure may also include a second barrier layer on surface of the first barrier layer in the first region and on surface of the by-product layer in the second region. In one embodiment, the second barrier layer may be made of silicon oxide. In certain embodiments, the second barrier layer may be made of silicon nitride, or amorphous silicon, etc. A thickness of the second barrier layer may be in a range of approximately 8 Å-30 Å.

In one embodiment, the disclosed method can be used to form FinFET devices having a critical dimension reduced to about 14 nm.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A method for fabricating a semiconductor device, comprising:
   providing a semiconductor substrate including a first region and a second region;
   forming a plurality of fins on the semiconductor substrate in the first region and the second region;
   forming a first barrier layer on surfaces of the fins in the first region;
   forming an isolation fluid layer on the semiconductor substrate to cover the first barrier layer in the first region and to cover the fins in the second region; and
   forming an isolation film and a by-product layer by an oxygen-containing annealing process respectively from the isolation fluid layer and sidewalls of the fins in the second region.

2. The method according to claim 1, wherein forming the first barrier layer on the surfaces of the fins in the first region includes:
- forming the first barrier layer on the surfaces of the fins in the first region and the second region; and
- removing a portion of the first barrier layer on the surfaces of the fins in the second region.

3. The method according to claim 1, wherein:
- a thickness of the first barrier layer is in a range of approximately 10 Å-40 Å.

4. The method according to claim 1, wherein:
- the first barrier layer is made of one of silicon nitride, silicon oxynitride, and silicon oxycarbide.

5. The method according to claim 1, wherein:
- the isolation film is made of silicon oxide.

6. The method according to claim 1, wherein:
- a mask layer is formed on top surfaces of the fins; and
- the isolation film covers the mask layer.

7. The method according to claim 1, further including:
- removing the isolation film and the first barrier layer above top surfaces of the fins;
- back-etching the isolation film, the first barrier layer and the by-product layer, such that surfaces of the isolation film, the first barrier layer and the by-product layer are lower than the top surfaces of the fins.

8. The method according to claim 1, wherein:
- the fins are made of one of silicon, germanium, and silicon germanium.

9. The method according to claim 1, before forming the isolation fluid layer, further including:
- forming a second barrier layer on surface of the first barrier layer and on surfaces of the fins in the second region.

10. The method according to claim 9, wherein:
- the second barrier layer is made of one of silicon oxide, silicon nitride, and amorphous silicon.

11. The method according to claim 9, wherein:
- a thickness of the second barrier layer is in a range of approximately 8 Å-30 Å.

12. The method according to claim 1, wherein:
- the oxygen-containing annealing process includes a water vapor annealing process.

13. The method according to claim 12, wherein parameters of the water vapor annealing process include:
- gases including oxygen gas, ozone, and gaseous water; and
- an annealing temperature in a range of approximately 350° C.-750° C.

14. The method according to claim 12, wherein forming the isolation fluid layer includes:
- a fluid chemical vapor deposition process.

15. The method according to claim 14, wherein the fluid chemical vapor deposition process includes:
- performing a densification annealing treatment on the isolation film after performing the water vapor annealing process.

16. The method according to claim 15, wherein parameters of the densification annealing treatment include:
- a gas including nitrogen gas; and
- an annealing temperature in a range of approximately 800° C.-1050° C.

17. A semiconductor device, comprising:
- a semiconductor substrate, including a first region and a second region;
- a plurality of fins, on the semiconductor substrate in the first region and the second region, wherein widths of the fins in the first region are larger than widths of the fins in the second region;
- a first barrier layer, on the semiconductor substrate and covering portions of sidewalls of the fins in the first region;
- a by-product layer, on the semiconductor substrate and covering portions of sidewalls of the fins in the second region; and
- an isolation film, covering the first barrier layer in the first region and covering the semiconductor substrate and the by-product layer in the second region, wherein the by-product layer is sandwiched between the isolation film and the sidewalls of the fins, and surfaces of the isolation film, the first barrier layer and the by-product layer are coplanar and are lower than top surfaces of the fins.

18. The semiconductor device according to claim 17, wherein:
- the fins are made of one of silicon, germanium, and silicon germanium;
- the isolation film is made of silicon oxide;
- the first barrier layer is made of one of silicon nitride, silicon oxynitride, and silicon oxycarbide; and
- a thickness of the first barrier layer is in a range of approximately 10 Å-40 Å.

19. A semiconductor device, comprising:
- a semiconductor substrate, including a first region and a second region;
- a plurality of fins, on the semiconductor substrate in the first region and the second region, wherein widths of the fins in the first region are larger than widths of the fins in the second region;
- a first barrier layer, on the semiconductor substrate and covering portions of sidewalls of the fins in the first region;
- a by-product layer, on the semiconductor substrate and covering portions of sidewalls of the fins in the second region; and
- an isolation film, on the semiconductor substrate and covering the first barrier layer and the by-product layer, wherein surfaces of the isolation film, the first barrier layer and the by-product layer are coplanar and are lower than top surfaces of the fins
- a second barrier layer between sidewalls of the first barrier layer and the isolation film in the first region and between sidewalls of the by-product layer and the isolation film in the second region.

20. The semiconductor device according to claim 19, wherein:
- the second barrier layer is made of one of silicon oxide, silicon nitride, and amorphous silicon; and
- a thickness of the second barrier layer is in a range of approximately 8 Å-30 Å.

* * * * *